(12) United States Patent
Wu et al.

(10) Patent No.: US 7,825,521 B2
(45) Date of Patent: Nov. 2, 2010

(54) STACK DIE PACKAGES

(75) Inventors: Albert Wu, Palo Alto, CA (US);
Huahung Kao, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 12/434,264

(22) Filed: May 1, 2009

(65) Prior Publication Data
US 2009/0212410 A1 Aug. 27, 2009

Related U.S. Application Data

(63) Continuation of application No. 11/801,317, filed on May 9, 2007, now Pat. No. 7,535,110.

(60) Provisional application No. 60/813,778, filed on Jun. 15, 2006.

(51) Int. Cl.
*H01L 23/48* (2006.01)
(52) U.S. Cl. .................. 257/777; 257/686; 257/723; 257/778
(58) Field of Classification Search .............. 257/686, 257/690, 778, E25.013, 777, 723, E23.141; 438/108, 109
See application file for complete search history.

(56) References Cited

U.S. PATENT DOCUMENTS 5,815,372 A 9/1998 Gallas

| | | | |
|---|---|---|---|
| 6,222,260 B1 | 4/2001 | Liang | |
| 6,271,598 B1 | 8/2001 | Vindasius et al. | |
| 2001/0002726 A1 | 6/2001 | Oka et al. | |
| 2003/0122237 A1 | 7/2003 | Saeki | |
| 2005/0212144 A1 | 9/2005 | Rugg et al. | |
| 2006/0094160 A1 | 5/2006 | Akram | |
| 2006/0097284 A1 | 5/2006 | Ronen | |

FOREIGN PATENT DOCUMENTS

JP 2001 196529 7/2001

OTHER PUBLICATIONS

International Search Report for Application No. PCT/US2007/013821 (corresponding hereto) mailed Jan. 21, 2008; 4 pages.

*Primary Examiner*—Roy K Potter

(57) ABSTRACT

An integrated circuit package includes a substrate comprising a first contact. A first integrated circuit mechanically attached to the substrate. The first integrated circuit comprising a second contact. A first redistribution layer arranged on the first integrated circuit. The first redistribution layer includes a trace coupled to the second contact. A first wire connects the first contact to the second contact. A flip-chip integrated circuit comprises a third contact connected to the trace by a conductive bump. A second integrated circuit mechanically coupled to the flip-chip integrated circuit. The second integrated circuit comprises a fourth contact. A second wire connects the fourth contact to at least the second contact or the first contact.

20 Claims, 4 Drawing Sheets

STACK DIE PACKAGES

CROSS-REFERENCE TO RELATED APPLICATIONS

This application is a continuation of U.S. patent application Ser. No. 11/801,317, filed May 9, 2007, which claims the benefit of U.S. Provisional Patent Application 60/813,778, filed Jun. 15, 2006, the disclosures thereof incorporated by reference herein in their entirety.

BACKGROUND

The present invention relates generally to integrated circuit manufacture. More particularly, the present invention relates to incorporating multiple integrated circuit dies in a single package.

In integrated circuit technology, it is desirable to incorporate multiple integrated circuit dies in a single package, for example to reduce the footprint of the package, and to ensure the dies experience the same environmental conditions. One way to achieve both of these objectives is to stack the dies on top of each other.

SUMMARY

In general, in one aspect, the invention features an integrated circuit package comprising: a substrate comprising first electric contacts; a first wirebond integrated circuit die mechanically coupled to the substrate and comprising second electric contacts electrically coupled to the first electric contacts of the substrate by first electrically conductive wires; a flip-chip integrated circuit die comprising third electric contacts electrically coupled to the second electric contacts of the first wirebond integrated circuit die by electrically conductive bumps; and a second wirebond integrated circuit die mechanically coupled to the flip-chip integrated circuit die and comprising fourth electric contacts electrically coupled to the second electric contacts of the first wirebond integrated circuit die, or the first electric contacts of the substrate, or both, by second electrically conductive wires.

In some embodiments, the first wirebond integrated circuit die comprises a redistribution layer comprising traces electrically coupling the electrically conductive bumps to the second electric contacts of the first wirebond integrated circuit die. In some embodiments, the second wirebond integrated circuit die further comprises: fifth electric contacts disposed near a first edge of the second wirebond integrated circuit die; and a redistribution layer comprising sixth electric contacts disposed near a second edge of the second wirebond integrated circuit die, and traces electrically coupling the fifth and sixth electric contacts; wherein the fourth electric contacts are disposed near the second edge of the second wirebond integrated circuit die; and wherein the sixth electric contacts are electrically coupled to the second electric contacts of the first wirebond integrated circuit die, or the first electric contacts of the substrate, or both, by the second electrically conductive wires. In some embodiments, the substrate and the first wirebond integrated circuit die are mechanically coupled by a first adhesive; and wherein the flip-chip integrated circuit die and the second wirebond integrated circuit die are mechanically coupled by a second adhesive. Some embodiments comprise an encapsulant surrounding the first wirebond integrated circuit die, the flip-chip integrated circuit die, the second wirebond integrated circuit die, and the electrically conductive wires. In some embodiments, the first wirebond integrated circuit die comprises a system-on-a-chip (SoC) electric circuit; wherein the flip-chip integrated circuit die comprises a flash memory; and wherein the second wirebond integrated circuit die comprises a synchronous dynamic random access memory (SDRAM).

In general, in one aspect, the invention features a method for fabricating an integrated circuit package, the method comprising: providing a substrate comprising first electric contacts; providing a first wirebond integrated circuit die comprising second electric contacts; mechanically coupling the first wirebond integrated circuit die to the substrate; electrically coupling the second electric contacts of the first wirebond integrated circuit die to the first electric contacts of the substrate using first electrically conductive wires; providing a flip-chip integrated circuit die comprising third electric contacts; electrically coupling the third electric contacts of the flip-chip integrated circuit die to the second electric contacts of the first wirebond integrated circuit die using electrically conductive bumps; providing a second wirebond integrated circuit die comprising fourth electric contacts; mechanically coupling the second wirebond integrated circuit die to the flip-chip integrated circuit die; and electrically coupling the fourth electric contacts of the second wirebond integrated circuit die to the second electric contacts of the first wirebond integrated circuit die, or the first electric contacts of the substrate, or both, using second electrically conductive wires.

Some embodiments comprise providing, on the first wirebond integrated circuit die, a redistribution layer comprising traces electrically coupling the electrically conductive bumps to the second electric contacts of the first wirebond integrated circuit die. Some embodiments comprise providing fifth electric contacts disposed near a first edge of the second wirebond integrated circuit die; providing a redistribution layer comprising sixth electric contacts disposed near a second edge of the second wirebond integrated circuit die, and traces electrically coupling the fifth and sixth electric contacts; wherein the fourth electric contacts are disposed near the second edge of the second wirebond integrated circuit die; and electrically coupling the sixth electric contacts of the redistribution layer to the second electric contacts of the first wirebond integrated circuit die, or the first electric contacts of the substrate, or both, by the second electrically conductive wires. Some embodiments comprise mechanically coupling the substrate and the first wirebond integrated circuit die using a first adhesive; and mechanically coupling the flip-chip integrated circuit die and the second wirebond integrated circuit die using a second adhesive. Some embodiments comprise surrounding the first wirebond integrated circuit die, the flip-chip integrated circuit die, the second wirebond integrated circuit die, and the electrically conductive wires with an encapsulant. In some embodiments, the first wirebond integrated circuit die comprises a system-on-a-chip (SoC) electric circuit; wherein the flip-chip integrated circuit die comprises a flash memory; and wherein the second wirebond integrated circuit die comprises a synchronous dynamic random access memory (SDRAM).

The details of one or more implementations are set forth in the accompanying drawings and the description below. Other features will be apparent from the description and drawings, and from the claims.

Figure 1:
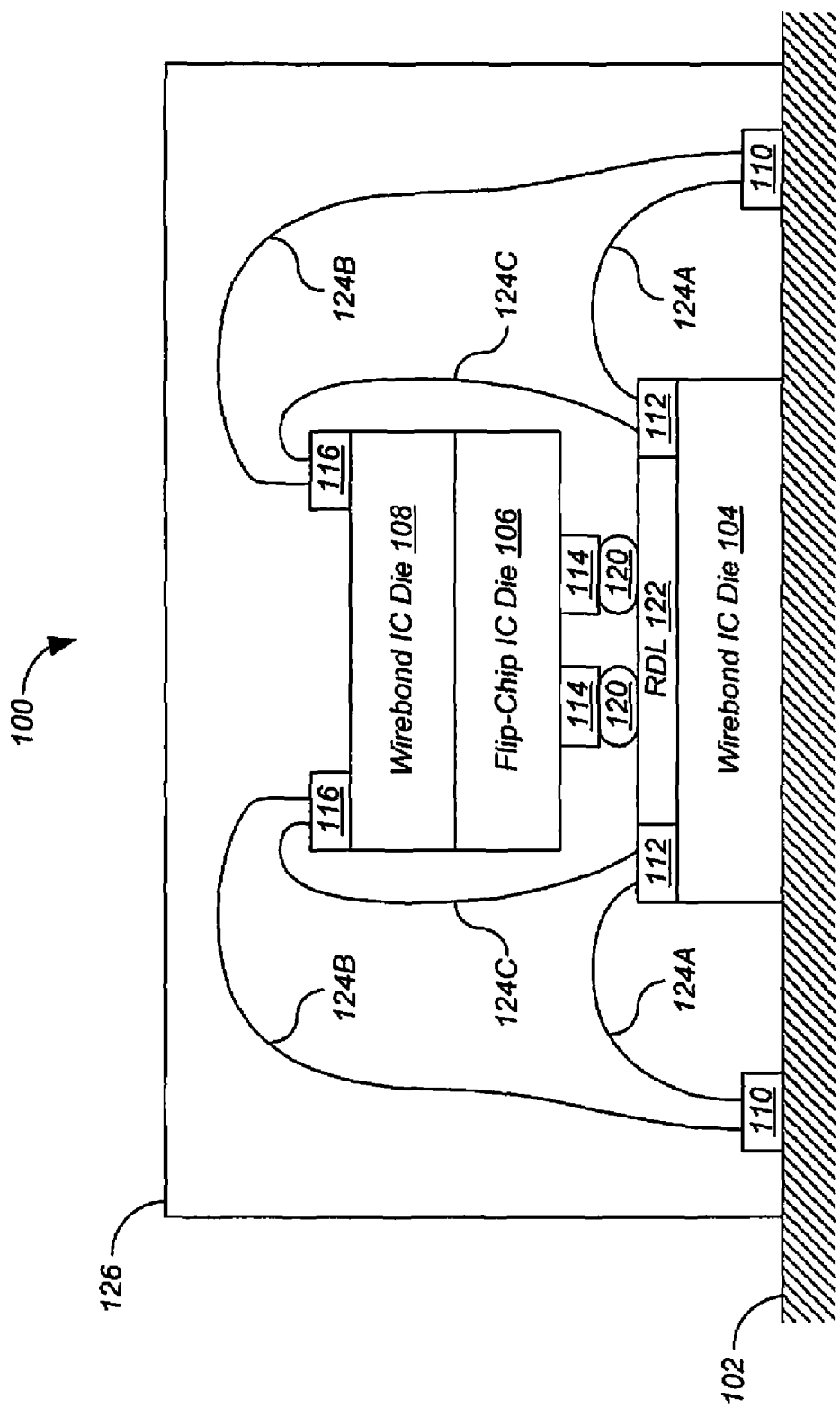
FIG. 1 shows a side view, not necessarily drawn to scale, of an integrated circuit package comprising a stack of three integrated circuit dies according to some embodiments of the present invention.

The leading digit(s) of each reference numeral used in this specification indicates the number of the drawing in which the reference numeral first appears.

DETAILED DESCRIPTION

Embodiments of the present invention provide integrated circuit packages comprising stacks of integrated circuit dies. According to some embodiments, an integrated circuit package comprises a substrate, a wirebond integrated circuit die atop the substrate, a flip-chip integrated circuit die atop the wirebond integrated circuit die, and a second wirebond integrated circuit die atop the flip-chip integrated circuit die. The contacts of the lower wirebond integrated circuit die are wirebonded to the substrate contacts. The contacts of the flip-chip integrated circuit die, which can be ball grid array (BGA) contacts, are connected to the contacts of the first wirebond integrated circuit die by electrically conductive bumps. The contacts of the upper wirebond integrated circuit die are wirebonded to the contacts of the lower wirebond integrated circuit die, or the contacts of the substrate, or both.

Redistribution layers can be used atop either or both of the wirebond integrated circuit dies. A redistribution layer can be used atop the lower wirebond integrated circuit die to connect the electrically conductive bumps to wirebond pads on the lower wirebond integrated circuit die. Another redistribution layer can be used atop the upper wirebond integrated circuit die to connect the wirebond pads from one edge of the upper wirebond integrated circuit die to wirebond pads on another edge, for example when the upper wirebond integrated circuit die is so large that wirebonds are only possible from one edge.

An adhesive can be used to mechanically couple the lower wirebond integrated circuit die to the substrate, and to mechanically couple the upper wirebond integrated circuit die to the flip-chip integrated circuit die. Mechanical coupling between the lower wirebond integrated circuit die and the flip-chip integrated circuit die is achieved by the electrically conductive bumps, but can be augmented by underfill techniques using an adhesive. The adhesives can include silver epoxy and the like. An encapsulant can be used to surround the stack of integrated circuit dies and the wirebond wires.

In some embodiments, the lower wirebond integrated circuit die comprises a system-on-a-chip (SoC) electric circuit, the flip-chip integrated circuit die comprises a flash memory, and the upper wirebond integrated circuit die comprises a synchronous dynamic random access memory (SDRAM). In other embodiments, other integrated circuits can be used.

FIG. 1 shows a side view, not necessarily drawn to scale, of an integrated circuit package 100 comprising a stack of three integrated circuit dies according to some embodiments of the present invention. Integrated circuit package 100 comprises a substrate 102, a wirebond integrated circuit die 104, a flip-chip integrated circuit die 106, and a wirebond integrated circuit die 108.

Substrate 102 has electric contacts 110 that can be connected to other devices, terminals, and the like. Wirebond integrated circuit die 104 has electric contacts (that is, wirebond pads) 112 that are connected by electrically conductive wires 124A to electric contacts 110 of substrate 102. Electrically conductive wires 124A can be implemented as gold wires and the like.

Flip-chip integrated circuit die 106 has electric contacts (that is, balls) 114 that are connected by electrically conductive bumps 120 to wirebond pads 112 of wirebond integrated circuit die 104. In some embodiments, a redistribution layer (RDL) 122 is used to connect electrically conductive bumps 120 to some or all of wirebond pads 112.

Figure 2:
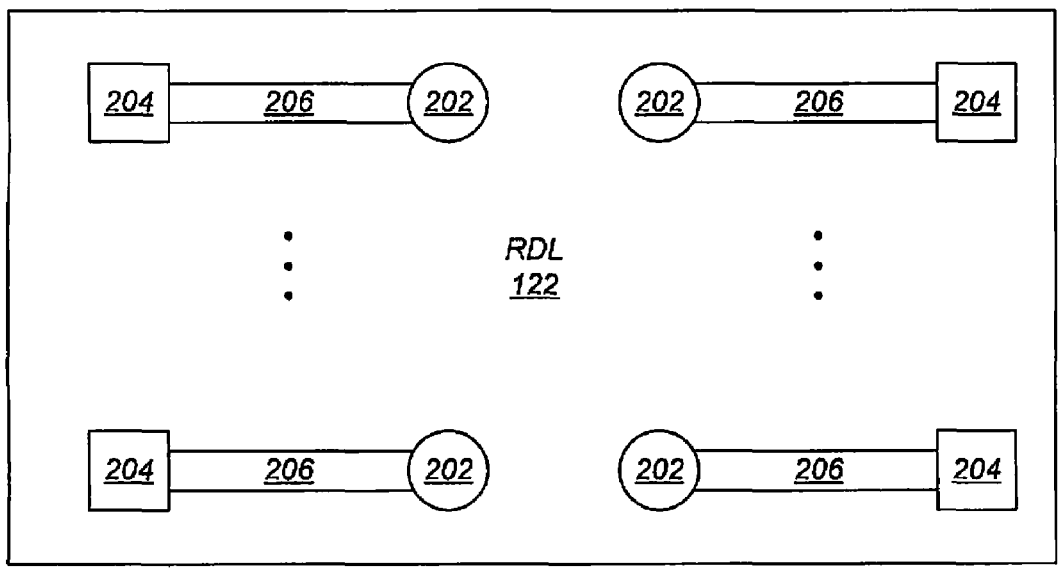
FIG. 2 shows a top view of the redistribution layer of FIG. 1 according to some embodiments of the present invention.

FIG. 2 shows a top view of redistribution layer 122 of FIG. 1 according to some embodiments of the present invention. Redistribution layer 122 includes electric contacts (that is, bump pads) 202 for connection to respective electrically conductive bumps 120 of flip-chip integrated circuit die 106, electric contacts 204 for connection to respective wirebond pads 112 of wirebond integrated circuit die 104, and electrically conductive traces 206 connecting respective bump pads 202 and electric contacts 204.

Referring again to FIG. 1, wirebond integrated circuit die 108 has electric contacts (that is, wirebond pads) 116. Wirebond pads 116 can be connected by electrically conductive wires 124B to electric contacts 110 of substrate 102, or can be connected by electrically conductive wires 124C to wirebond pads 112 of wirebond integrated circuit die 104, or both. Electrically conductive wires 124B-C can be implemented as gold wires and the like.

In various embodiments, some or all of wirebond pads 112 on wirebond integrated circuit die 104 are electrically coupled to the integrated circuit within wirebond integrated circuit die 104. But in some embodiments, some of wirebond pads 112 are not coupled to the integrated circuit, but are provided instead for connections between other elements of integrated circuit package 100. For example, some of wirebond pads 112 can be used to provide connections between balls 114 of flip-chip integrated circuit die 106 and electric contacts 110 of substrate 102. As another example, in embodiments where electrically conductive wires 124B are not used, some of wirebond pads 112 can be used to provide connections between wirebond pads 116 of wirebond integrated circuit die 108 and electric contacts 110 of substrate 102.

Integrated circuit dies 104-108 and electrically conductive wires 124 can be surrounded by an encapsulant 126.

While FIG. 1 depicts connections on two edges of each integrated circuit die 104-108, three or more edges can connected as shown in FIG. 1. However, in some embodiments, the topmost wirebond integrated circuit die 108 is so large that one or more of its edges cannot be wirebonded. In these embodiments, a redistribution layer is used atop the topmost wirebond integrated circuit die 108 to connect the electric contacts 116 from the other edge.

Figure 3:
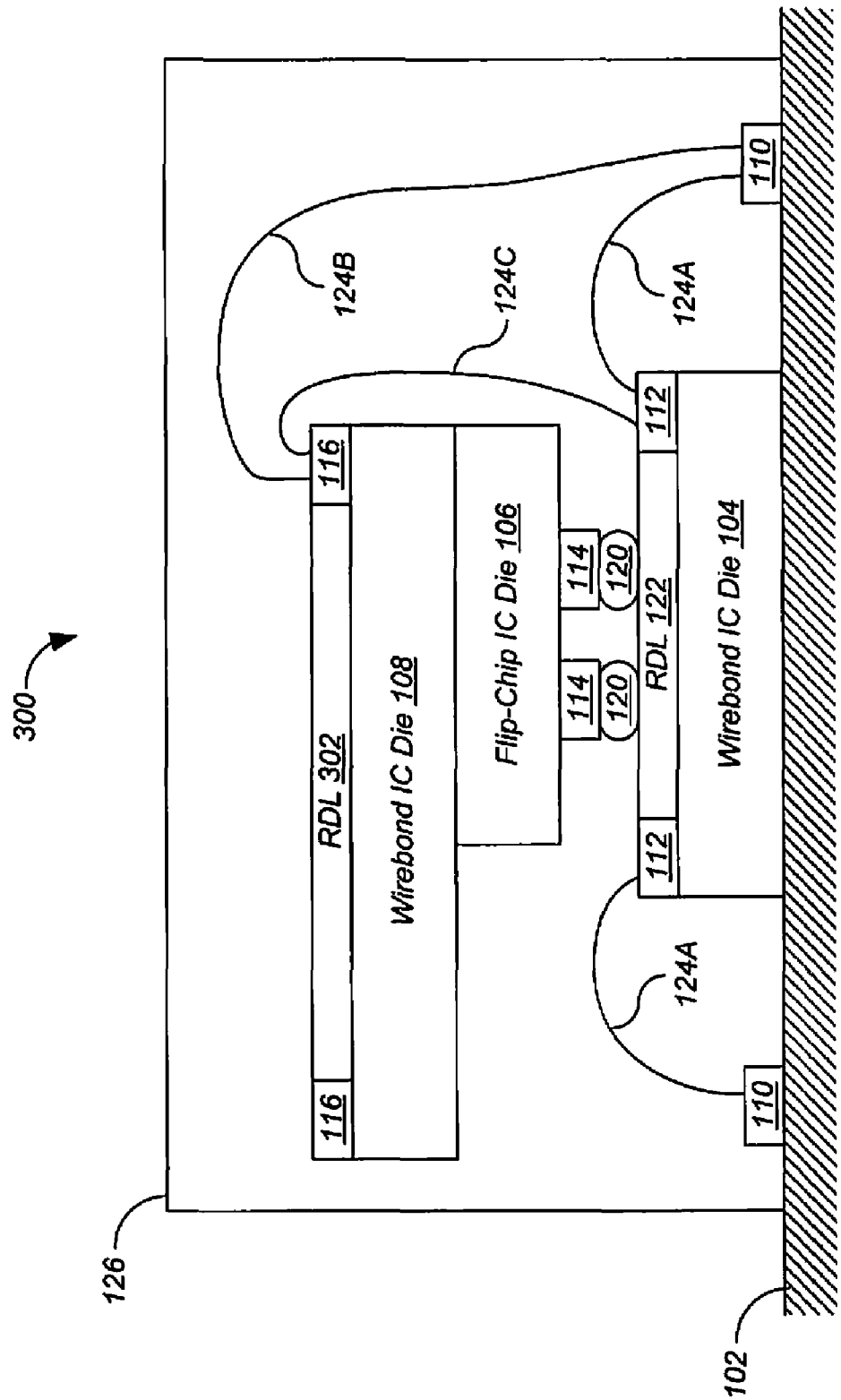
FIG. 3 shows a side view, not necessarily drawn to scale, of an integrated circuit package comprising a stack of three integrated circuit dies with a redistribution layer on the top die according to some embodiments of the present invention.

FIG. 3 shows a side view, not necessarily drawn to scale, of an integrated circuit package 300 comprising a stack of three integrated circuit dies with a redistribution layer on the top die according to some embodiments of the present invention. As can be seen in FIG. 3, the left edge of the top die, wirebond integrated circuit die 108, so overhangs the lower wirebond integrated circuit die 104 that wirebond connections are not possible for electric contacts 116 on that edge. In such embodiments, a redistribution layer (RDL) 302 is used to connect wirebond pads 116 on the left edge to some of the wirebond pads 116 on the right edge.

Figure 4:
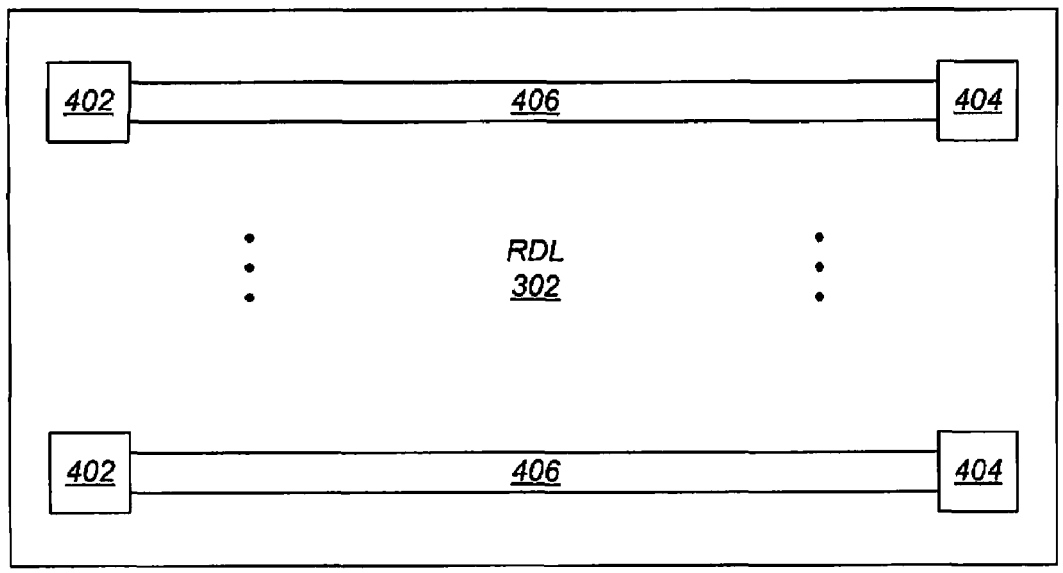
FIG. 4 shows a top view of the redistribution layer of FIG. 3 according to some embodiments of the present invention.

FIG. 4 shows a top view of redistribution layer 302 of FIG. 3 according to some embodiments of the present invention. Redistribution layer 302 includes electric contacts 402 for connection to respective wirebond pads 116 on the left edge of wirebond integrated circuit die 108, electric contacts 404 for connection to respective wirebond pads 116 on the right edge of wirebond integrated circuit die 108, and electrically conductive traces 406 connecting respective electric contacts 402 and 404.

Figure 5:
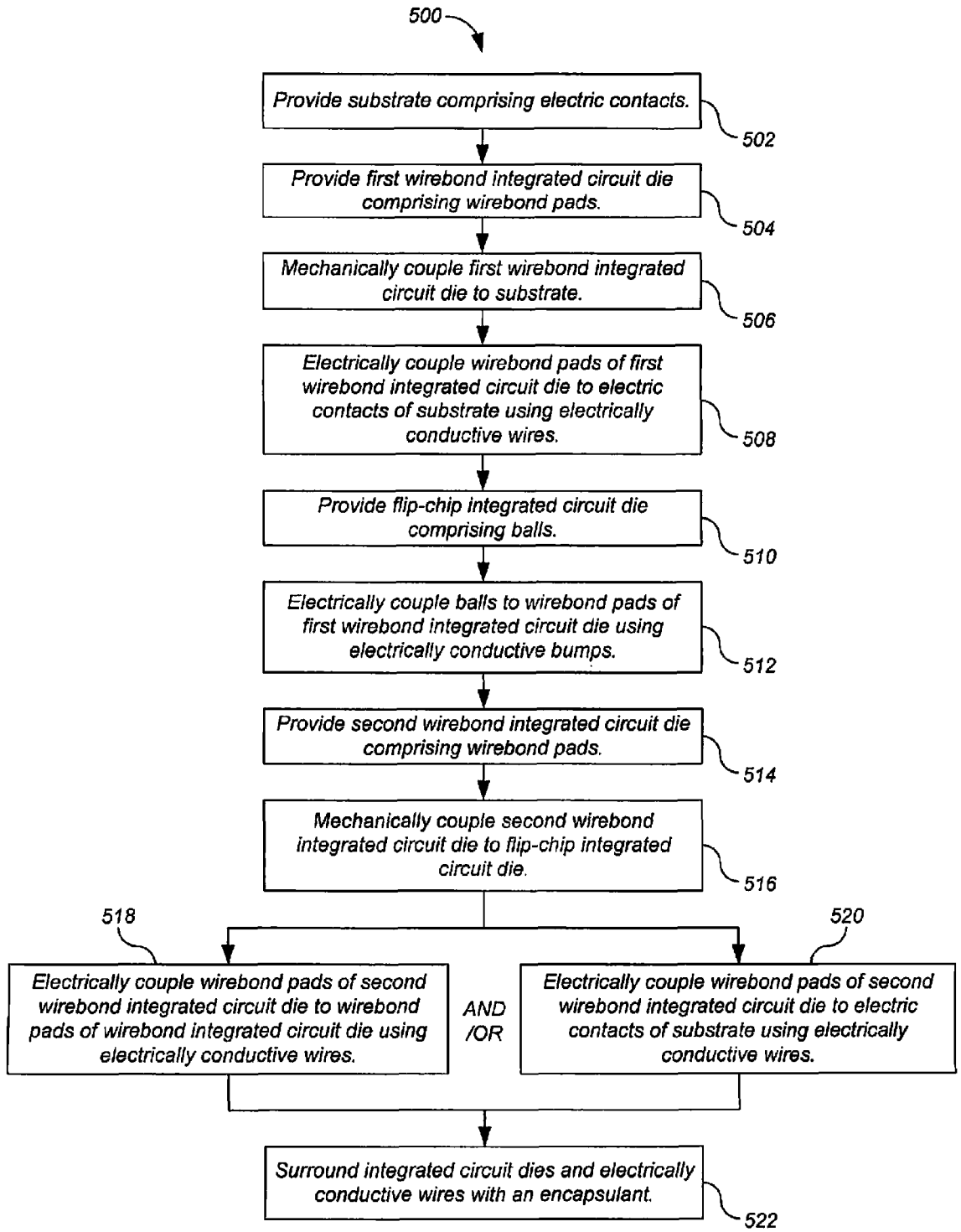
FIG. 5 shows a process for fabricating integrated circuit packages according to embodiments of the present invention.

FIG. 5 shows a process 500 for fabricating integrated circuit packages according to embodiments of the present invention. For example, process 500 can be used to fabricate integrated circuit package 100 of FIG. 1 and integrated circuit package 300 of FIG. 3. For clarity, process 500 is discussed with reference to integrated circuit package 100 of FIG. 1. Although in the described embodiments, the elements of process 500 are presented in one arrangement, other embodiments feature other arrangements, as will be apparent to one skilled in the relevant arts after reading this description.

Referring to FIG. 5, process 500 provides substrate 102 comprising electric contacts 110 (step 502). Process 500 also provides wirebond integrated circuit die 104 comprising wirebond pads 112 (step 504). Process 500 mechanically couples wirebond integrated circuit die 104 to substrate 102 (step 506), for example using an adhesive such as silver epoxy and the like. Process 500 also electrically couples wirebond pads 112 of wirebond integrated circuit die 104 to electric contacts 110 of substrate 102 using electrically conductive wires 124A (step 508).

Process 500 also provides flip-chip integrated circuit die 106 comprising balls 114 (step 510), and electrically couples balls 114 to wirebond pads 112 of wirebond integrated circuit die 104 using electrically conductive bumps 120 (step 512). In some embodiments, a redistribution layer 122 is used to electrically couple wirebond pads 112 to electrically conductive bumps 120, as described above in detail with reference to FIG. 2.

Process 500 also provides wirebond integrated circuit die 108 comprising wirebond pads 116 (step 514), and mechanically couples wirebond integrated circuit die 108 to flip-chip integrated circuit die 106 (step 516), for example using an adhesive such as silver epoxy and the like. Process 500 also electrically couples wirebond pads 116 of wirebond integrated circuit die 108 to wirebond pads 112 of wirebond integrated circuit die 104 using electrically conductive wires 124C (step 518), or electrically couples wirebond pads 116 to electric contacts 110 of substrate 102 using electrically conductive wires 124B (step 520), or both. In some embodiments, a redistribution layer 302 is used to electrically couple wirebond pads 116 on one edge of wirebond integrated circuit die 108 to wirebond pads 116 on another edge, as described above in detail with reference to FIG. 4.

Finally, process 500 surrounds integrated circuit dies 104-108 and electrically conductive wires 124 with an encapsulant 126 (step 522).

A number of implementations of the invention have been described. Nevertheless, it will be understood that various modifications may be made without departing from the spirit and scope of the invention. Accordingly, other implementations are within the scope of the following claims.

What is claimed is:

1. An integrated circuit package comprising:
a substrate comprising a first contact;
a first integrated circuit mechanically attached to the substrate, the first integrated circuit comprising a second contact;
a first redistribution layer arranged on the first integrated circuit, the first redistribution layer including a trace coupled to the second contact;
a first wire connecting the first contact to the second contact;
a flip-chip integrated circuit comprising a third contact connected to the trace by a conductive bump;
a second integrated circuit mechanically coupled to the flip-chip integrated circuit, the second integrated circuit comprising a fourth contact; and
a second wire connecting the fourth contact to at least the second contact or the first contact.

2. The integrated circuit package of claim 1, wherein:
the second integrated circuit further comprises a fifth contact, the fifth contact being arranged near a first edge of the second integrated circuit; and
the fourth contact is arranged near a second edge of the second integrated circuit.

3. The integrated circuit package of claim 2, further comprising:
a second redistribution layer arranged on the second integrated circuit between the fourth contact and the fifth contact, the second redistribution layer including a trace that couples the fourth contact to the fifth contact.

4. The integrated circuit package of claim 1, further comprising:
a first adhesive that attaches the substrate to the first integrated circuit;
a second adhesive that attaches the flip-chip integrated circuit to the second integrated circuit; and
an encapsulant enclosing at least a portion of the first integrated circuit, the flip-chip integrated circuit, the second integrated circuit, the first wire and the second wire.

5. The integrated circuit package of claim 1, wherein:
the first integrated circuit comprises a system-on-a-chip (SoC);
the flip-chip integrated circuit comprises flash memory; and
the second integrated circuit comprises a synchronous dynamic random access memory (SDRAM).

6. An integrated circuit package comprising:
a substrate comprising a first contact and a second contact;
a first integrated circuit including
a first side mechanically attached to the substrate between the first contact and the second contact; and
a second side including a third contact and a fourth contact;
a first redistribution layer arranged on the second side of the first integrated circuit between the third contact and the fourth contact, the first redistribution layer including a first trace and a second trace respectively coupled to the third contact and the fourth contact;
a first wire connecting the first contact to the third contact, and a second wire connecting the second contact to the fourth contact;
a flip-chip integrated circuit including a first side having a fifth contact and a sixth contact, the fifth contact being connected to the first trace by a first conductive bump, the sixth contact being connected to the second trace by a second conductive bump;
a second integrated circuit including:
a first side that is mechanically coupled to the flip-chip integrated circuit;
a second side with a seventh contact; and
a third wire connecting the seventh contact to at least the second contact or the fourth contact.

7. The integrated circuit package of claim 6, wherein:
the second integrated circuit further comprises an eighth contact arranged near a first edge of the second side of the second integrated circuit; and the seventh contact is arranged near a second edge of the second integrated circuit.

8. The integrated circuit package of claim 7, further comprising:
a second redistribution layer arranged on the second side of the second integrated circuit between the seventh contact and the eighth contact, the second redistribution layer including a third trace that couples the seventh contact to the eighth contact.

9. The integrated circuit package of claim 6, wherein:
the second integrated circuit further comprises an eighth contact arranged near a first edge of the second side of the second integrated circuit,
the seventh contact are arranged near a second edge of the second integrated circuit, and
the integrated circuit further comprises a fourth wire that connects the eighth contact to at least the first contact or the third contact.

10. The integrated circuit package of claim 6, further comprising:
a first adhesive that attaches the substrate to the first side of the first integrated circuit;
a second adhesive that attaches a second side of the flip-chip integrated circuit to the first side of the second integrated circuit; and
an encapsulant enclosing at least a portion of the first integrated circuit, the flip-chip integrated circuit, the second integrated circuit, the first wire, the second wire, and the third wire.

11. The integrated circuit package of claim 6, wherein:
the first integrated circuit comprises a system-on-a-chip (SoC);
the flip-chip integrated circuit comprises flash memory; and
the second integrated circuit comprises a synchronous dynamic random access memory (SDRAM).

12. An integrated circuit package comprising:
a substrate comprising a first contact;
a first integrated circuit mechanically attached to the substrate, the first integrated circuit comprising a second contact;
a first wire connecting the first contact to the second contact;
a flip-chip integrated circuit comprising a third contact that communicates with the second contact via a conductive bump;
a second integrated circuit mechanically attached to the flip-chip integrated circuit, the second integrated circuit comprising a fourth contact; and
a second wire connecting the fourth contact to the second contact.

13. The integrated circuit package of claim 12, wherein:
the second integrated circuit further comprises a fifth contact arranged adjacent to a first edge of the second integrated circuit; and
the fourth contact is arranged adjacent to a second edge of the second integrated circuit.

14. The integrated circuit package of claim 13, further comprising a redistribution layer comprising a trace that couples the fourth contact to the fifth contact.

15. The integrated circuit package of claim 12, further comprising:
a first adhesive that attaches the substrate to the first integrated circuit;
a second adhesive that attaches the flip-chip integrated circuit to the second integrated circuit; and
an encapsulant enclosing at least a portion of the first integrated circuit, the flip-chip integrated circuit, the second integrated circuit, the first wire, and the second wire.

16. The integrated circuit package of claim 12, wherein:
the first integrated circuit comprises a system-on-a-chip (SoC);
the flip-chip integrated circuit comprises flash memory; and
the second integrated circuit comprises a synchronous dynamic random access memory (SDRAM).

17. An integrated circuit package comprising:
a substrate comprising a first contact;
a first integrated circuit mechanically attached to the substrate, the first integrated circuit comprising a second contact;
a first wire connecting the first contact to the second contact;
a flip-chip integrated circuit comprising a third contact that communicates with the second contact via a conductive bump;
a second integrated circuit mechanically attached to the flip-chip integrated circuit, the second integrated circuit comprising a fourth contact; and
a second wire that connects the fourth contact to the first contact and the second contact.

18. The integrated circuit package of claim 17, wherein:
the second integrated circuit further comprises a fifth contact arranged adjacent to a first edge of the second integrated circuit; and
the fourth contact is arranged adjacent to a second edge of the second integrated circuit.

19. The integrated circuit package of claim 18, further comprising a redistribution layer comprising a trace that couples the fourth contact to the fifth contact.

20. The integrated circuit package of claim 17, wherein:
the first integrated circuit comprises a system-on-a-chip (SoC);
the flip-chip integrated circuit comprises flash memory; and
the second integrated circuit comprises a synchronous dynamic random access memory (SDRAM).

* * * * *